United States Patent [19]

Clemans et al.

[11] Patent Number: 5,064,497

[45] Date of Patent: Nov. 12, 1991

[54] CRYSTAL GROWTH METHOD AND APPARATUS

[75] Inventors: Jim E. Clemans, Trenton, N.J.; Theophilus I. Ejim, Fairless Hills, Pa.; Maria J. Yuen, Hopewell, N.J.

[73] Assignee: AT&T Bell Laboratories, Murray Hill, N.J.

[21] Appl. No.: 490,903

[22] Filed: Mar. 9, 1990

[51] Int. Cl.$^5$ .............................................. C30B 11/14
[52] U.S. Cl. .................................. 156/616.1; 156/667; 156/616.2; 156/616.3; 156/616.4; 156/616.41; 156/DIG. 70; 156/DIG. 83; 422/248; 164/122; 164/122.1; 164/122.2
[58] Field of Search ............. 422/248; 156/607, 616.1, 156/616.2, 616.3, 616.4, 616.41, DIG. 70, DIG. 83; 164/122, 122.1, 122.2

[56] References Cited

U.S. PATENT DOCUMENTS

| | | | |
|---|---|---|---|
| 2,361,382 | 10/1944 | Camin | 156/616.41 |
| 2,908,739 | 10/1959 | Rummel | 156/DIG. 83 |
| 3,240,568 | 3/1966 | Desby et al. | 156/DIG. 83 |
| 3,649,193 | 3/1972 | Deyris | 156/616.2 |
| 3,898,051 | 8/1975 | Schmid | 156/616.41 |
| 4,404,172 | 9/1983 | Gault | 422/248 |
| 4,904,336 | 2/1990 | Ozawa et al. | 156/DIG. 83 |
| 4,946,542 | 8/1990 | Clemans | 422/248 |

OTHER PUBLICATIONS

"A Novel Application of the Vertical Gradient Freeze Method to the Growth of High Quality III-V Crystals," by W. A. Gault et al., *Journal of Crystal Growth*, vol. 74, 1986, pp. 491-506.

Primary Examiner—Robert Kunemund
Attorney, Agent, or Firm—R. B. Anderson

[57] ABSTRACT

In a compound semiconductor crystal growth process, the crucible (11) that contains the semiconductor melt is contacted on its opposite surface by a material (26) which, when melted, reacts with the crucible. The reacting material is melted along with the compound semiconductor material and thereafter reacts with the wall (24) of the crucible that contains the semiconductor melt. During the entire growth process, the wall is sufficiently thick to separate the reacting material from the compound semiconductor material, but is sufficiently thin that the reacting material significantly weakens its structural integrity. As a consequence, thermal stresses resulting from differential contraction of the compound semiconductor material and the wall during the cooling step are relieved by fracture of the crucible wall.

26 Claims, 2 Drawing Sheets

CRYSTAL GROWTH METHOD AND APPARATUS

TECHNICAL FIELD

This invention relates to processes for making objects in crucibles, and, more particularly, to methods and apparatus for growing ingots of group III-V and group II-VI compound semiconductors from which monocrystalline wafers can be cut.

BACKGROUND OF THE INVENTION

One of the most significant developments in semiconductor technology in recent years has been the increased use and importance of compound semiconductors, particularly the group III-V compounds composed of elements III and V of the periodic table such as gallium arsenide and indium phosphide. Such materials are used, for example, for making lasers, light emitting diodes, microwave oscillators and light detectors. Also promising are the group II-VI compounds such as cadmium telluride which may be used for making light detectors and other devices.

Most commercial use of compound semiconductors requires the growth of large single-crystal ingots from which wafers can be cut for the subsequent fabrication of useful devices. One of the more promising methods for such crystal growth is the vertical gradient freeze (VGF) method, particularly the VGF method described in the U.S. patent of W. A. Gault, U.S. Pat. No. 4,404,172, granted Sept. 13, 1983, and the paper, "The Novel Application of the Vertical Gradient Freeze Method to the Growth of High Quantity III-V Crystals," by W. A. Gault et al., *Journal of Crystal Growth*, Vol. 74, pp. 491-506, 1986, both of which are hereby incorporated herein by reference. According to this method, raw semiconductor material is placed in a vertically extending crucible, typically of pyrolytic boron nitride, which includes a small crystal seed well portion at its bottom end snugly containing a monocrystalline seed crystal. Initially, the raw material and a portion of the seed crystal are melted. An encapsulant material such as boric oxide can be included to aid in containing volatile vapors within the melt. The temperature of the system is then reduced in such a manner that freezing proceeds vertically upwardly from the seed crystal, with the crystal structure of the grown ingot corresponding to that of the seed crystal.

It is known that the high thermal conductivity of the pyrolytic boron nitride (PBN) crucible relative to the semiconductor melt creates a concave solidliquid interface near the crucible wall during crystal growth. It is believed that this shape, in combination with chemical interaction at the crucible wall and other parameters such as the stability of the growth rate, can be a cause of a crystallographic dislocation defect known as "twinning" when one attempts to grow the crystal, in particular, an indium phosphide crystal, in the <100> crystallographic orientation. Growth in the <100> orientation is desired because wafers can thereafter be cut perpendicularly to the ingot axis to obtain the appropriate crystallographic surface for device processing.

A common solution to the problem of twinning is to orient the seed crystal in a PBN crucible such that the semiconductor crystal grows in the <111> crystallographic direction (or, more specifically, the $<111>_B$ direction), which has been recognized to avoid or to reduce the incidence of twinning. When this is done, however, the wafer must be cut at an angle with respect to the ingot central axis of about 35.3 degrees so that the upper surfaces of such wafers lie in a crystallographic plane that is appropriate for device fabrication. Since the ingot is cylindrical, the slices or wafers cut at this angle are elliptical. It is difficult to use elliptically shaped semiconductor wafers efficiently and a significant wastage of usable semiconductor wafer area inherently accompanies their use.

Workers have alternatively tried to overcome the twinning problem by using quartz crucibles which have a much lower thermal conductivity and a different surface chemistry than that of the PBN crucible. However, quartz crucibles raise a new set of problems. During ingot cooling, there is a strong adherence between the glass crucible and the ingot by way of an intermediate layer of boric oxide, the material used as an encapsulant. The cooling results in a differential thermal contraction of the crucible, the boric oxide, and the ingot, which creates stresses that tend to fracture the ingot, rendering it in most cases useless.

Accordingly, there has been a long-felt need for a method for reducing the number of defects in grown compound semiconductor ingots. There has also been a need for such a method that is consistent with the growth of ingots in the <100> crystallographic direction.

SUMMARY OF THE INVENTION

In accordance with the invention, the wall of the crucible that contains the compound semiconductor melt is contacted on its opposite surface by a material which, when melted, reacts with the crucible. The reacting material is melted along with the semiconductor compound material and thereafter reacts with the wall of the crucible that contacts the semiconductor melt. During the entire growth process, the wall is sufficiently thick to separate the reacting material from the compound semiconductor material, but is sufficiently thin that the reacting material significantly weakens its structural integrity. As a consequence, stresses resulting from differential contraction between the ingot and the wall during the cooling step are relieved by fracture of the crucible wall.

The invention is preferably implemented by using a double-walled glass crucible, the outer wall of which holds a quantity of an inorganic salt such as calcium chloride. The salt devitrifies and weakens the inner crucible glass wall so that it can fracture, thus relieving thermal stress that would otherwise be imparted to the crystal ingot. The glass reduces the twinning problem characteristic of growth in the <100> direction in a PBN crucible, in part due to the low thermal conductivity and a surface chemistry as modified by reaction with boric oxide. The liquid inorganic salt is also beneficial to crystal growth in that it tends to make more symmetrical the heat distribution along the inner crucible wall and to dampen thermal fluctuations during crystal growth. With these improvements, it is possible to grow compound semiconductor crystals such as indium phosphide in the <100> direction without causing twinning, significant dislocations or stress fractures. The ingot can thereafter be sliced perpendicularly to its central axis to give circular or disc-shaped wafers.

These and other objects, features and benefits of the invention will be better understood from a consideration of the following detailed description taken in conjunction with the accompanying drawing.

DETAILED DESCRIPTION

The aforementioned Gault patent and Gault et al. publication describe in detail the apparatus to be used and procedural steps to be followed in successfully growing monocrystalline compound semiconductor ingots in accordance with the VGF method. For the sake of brevity and for the purpose of emphasizing the improvements which constitute the present invention, such details will not be repeated, it being understood that the preferred method of implementing the invention is through the use of the VGF method, although other methods could be used. It should also be understood that while terms such as "monocrystalline" and "single-crystal" are used to describe ingots, most ingots contain defects or localized departures from monocrystallinity, and successful growing methods are those that reduce, control, or minimize, not necessarily eliminate, such defects.

Figure 1:
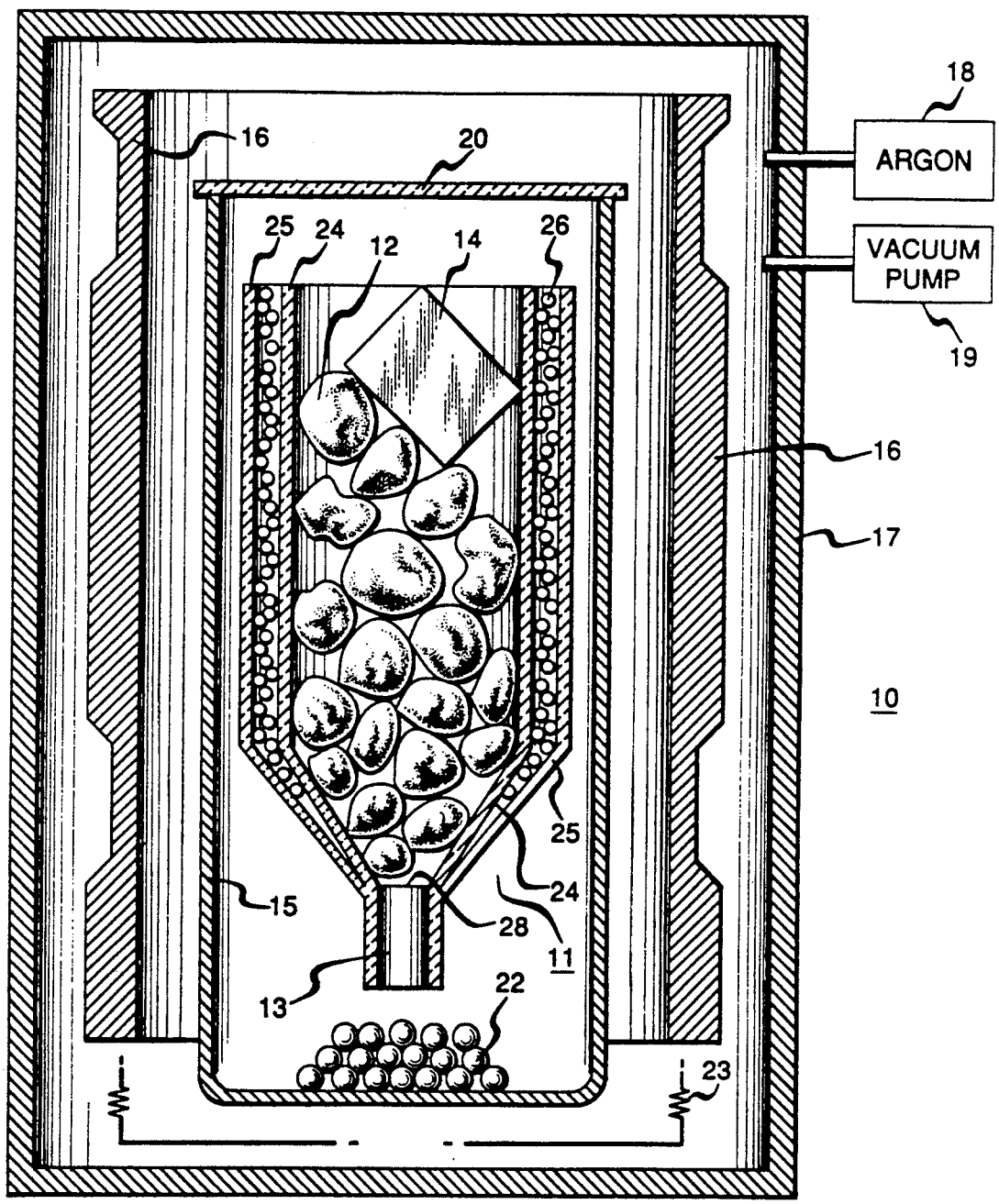
FIG. 1 illustrates a sectional schematic view of crystal growing apparatus including a crucible in accordance with an illustrative embodiment of the invention.

Referring now to FIG. 1, there is shown a crystal growth apparatus 10 including a crucible 11 partially filled with a quantity 12 of a raw material of the crystal to be grown; if monocrystalline indium phosphide is to be grown, the raw material is typically polycrystalline pieces of indium phosphide. A cylindrical monocrystalline seed crystal 13 of the material to be grown is snugly fitted into a lower seed well portion of the crucible. Also located in the crucible is a quantity 14 of a relatively low density encapsulant material such as boric oxide. The crucible is contained within a growth vessel 15 which is surrounded by a heater element 16 which is capable of melting the raw material and cooling it in a controlled manner in accordance with the VGF process. The crucible and heater are both contained within an air-tight pressure vessel 17 from which air can be pumped by a vacuum pump 19 and into which argon can be pumped from a source 18. Argon is pumped into the pressure vessel at a high pressure and can enter the growth vessel 15 since the vessel has a cover 20 which is loosely fitting.

In accordance with the conventional VGF process, if a III-V crystal is to be grown, a quantity 22 of the group V element is included at the bottom of the growth vessel 16. This is separately heated by a heater 23 to vaporize within the growth vessel the group V element to provide an overpressure at the surface of the crucible to retard evaporation of the group V component from the melt. For example, with the growth of indium phosphide, the phosphorus component tends to vaporize when the raw material 12 is melted, in which case the material 22 is red phosphorus which is vaporized separately to provide a phosphorus overpressure. As is described in the co-pending application of T. I. Ejim, U.S. Ser. No. 315,667, filed Feb. 27, 1989, elemental phosphorus can alternatively be added directly to the melt. The molten boric oxide floats on top of the molten indium phosphide and together with the vaporized phosphorus and the argon pressure, at a pressure of typically twenty-six to fifty atmospheres, cooperate to contain the phosphorus element within the melt. As described in the Gault patent, especially designed thermally conductive elements (not shown) cooperate with the design of heater element 16 to give a predetermined temperature gradient within the crucible which, as the heater power is reduced, gives progressive freezing in the upward direction from seed crystal. The crystalline orientation of the growing crystal is determined by the orientation of the seed crystal 13.

Figure 2:
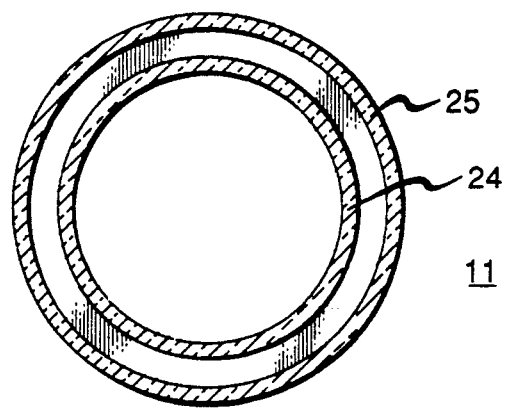
FIG. 2 is a top sectional view of the crucible of FIG. 1.

Referring especially to FIG. 2, which is a section taken transversely to the central axis of the crucible along the major portion of the crucible, the crucible 11 is double walled, having an inner wall 24 and an outer wall 25. The inner and outer walls define therebetween an annular space for containing a reacting material 26 such as calcium chloride that is capable of reacting in its molten state with the inner wall 24 of the crucible, which may be of glass. Also in accordance with the invention, the seed crystal 13 is arranged such that its $<100>$ orientation is co-axial with the crucible, in which case the surface 28 constitutes the $\{100\}$ crystallographic plane. Under these circumstances, during the freezing step, single-crystal compound semiconductor material growing from surface 28 of seed crystal 13 will grow vertically upwardly in the $<100>$ crystallographic direction. Thereafter, wafers can be cut perpendicularly to the central axis of the grown ingot to yield circular wafers having appropriate $\{100\}$ surfaces for the subsequent fabrication of devices.

In the interest of conciseness, separate drawings have not been made showing the various states of the materials used. In the case of indium phosphide, the melting temperature of the raw indium phosphide polycrystals is 1065° C.; the melting point of boric oxide is 450° C.; and the melting point of the calcium chloride 26 is 782° C. Initially, all of the raw material 12 (e.g., indium phosphide), boric oxide 13 and the reacting material 26 (e.g., calcium chloride) are melted along with an upper portion of seed crystal 13. When it is molten, the calcium chloride 26 reacts with the glass crucible walls to weaken them, particularly the inner crucible wall 24. It also surrounds the molten indium phosphide and tends to reduce the amplitude of thermal fluctuations in the environment which are transmitted to the crucible, and to even out any thermal asymmetries that might occur around the crucible. After the molten indium phosphide has solidified, it contracts as the temperature is lowered further and liquid boric oxide flows into the gap between the crucible and the frozen InP ingot. When the boric oxide freezes, it bonds the ingot to the crucible wall.

With further temperature lowering, stresses are created between the ingot and crucible because of differential rates of thermal contraction. In the absence of the invention, these stresses would typically result in a fracturing of the InP ingot. However, with the invention, prior to this cooling step, the liquid calcium chloride reacts with and devitrifies the outer surface of inner crucible wall 24, making the wall susceptible to fracture. Thus, stress due to differential contraction results in local fracturing of the inner wall 24 rather than fracturing of the ingot.

We have successfully grown ingots of indium phosphide which clearly would have been ruined or damaged by stress fractures without the use of the invention. Subsequent examination of the inner wall of the glass crucible 24 shows devitrification of the outer surface of inner wall 24. This is due to a reaction of the liquid calcium chloride and glass (silicon dioxide) and it only extends a small distance into the glass wall. Nevertheless, it significantly weakens the glass structure so that under stress cracks occur across its thickness. Since these cracks form only after solidification of the crystal ingot, they do not interfere with the crystal growing process. The damage precludes reuse of the crucible; however, since such crucibles are made of silicon dioxide (glass), many of them can be made reasonably inexpensively by conventional glass working techniques. There is an absence of twinning, which is a defect which normally occurs if one endeavors to grow indium phosphide in the <100> direction in a pyrolytic boron nitride crucible. This absence is due to a number of factors, including: the low thermal conductivity of glass relative to pyrolytic boron nitride; the chemistry of the crucible surface when coated with boric oxide; and the reduction of thermal fluctuations at the growing crystal surface due to the thermal buffering action of the molten calcium chloride.

It is intended that the inner wall 24 be sufficiently thick to separate the reacting material 26 from the compound semiconductor material 12, but sufficiently thin that the reacting material significantly weakens the wall 24. A crucible which was made and that illustrates the invention was 25.4 centimeters long with a seed well length of twenty-eight millimeters. The inner wall 24 had a thickness of 1.5 millimeters and the outer wall 25 was 2.5 millimeters thick. The radial distance between the inner and outer walls was 6.5 millimeters. With these dimensions, wall 24 served as a practical separation or barrier between the indium phosphide semiconductor material and the calcium chloride reacting material, and yet it was thin enough so that after devitrification it was structurally weaker than the InP ingot.

The purpose of the outer wall 25 of the crucible is simply to contain the calcium chloride in contact with the outer surface of inner wall 24. Other schemes for containing the calcium chloride in this manner could be used if so desired. The double wall is shown in FIG. 1 as extending the entire distance to the seed crystal 13. We have successfully used double wall portions which, for fabrication expediency, extended only the length of the major cylindrical portion of the crucible, and these were found to be beneficial, although containment of the calcium chloride for the entire distance to the seed well portion as shown in the drawing is preferred. Other inorganic salts could be used as an alternative to calcium chloride for controllably devitrifying the glass crucible as described; specifically, various halide salts such as sodium chloride and sodium bromide would appear to be capable, when melted, of reacting with glass as described.

Glass, and more specifically, quartz, appears to be the most practical crucible material since it is inexpensive and provides technical benefits mentioned above, but in principle other materials could be used in combination with surrounding reacting materials with which they may chemically react. The invention may be used to reduce stresses on ingots in processes other than the VGF process, such as the known horizontal gradient freeze process, the electrodynamic gradient freeze (EDGF) process, the horizontal or vertical Bridgman process, the horizontal or vertical Stockbarger process, zone refining based processes and others.

We have made use of the fact that a glass wall can be significantly structurally weakened by a chemical reaction on one surface that extends only a small distance into the wall. This finding could be used in making molded objects, where it is preferred that thermal stress cause damage to the mold rather than the molded object; i.e., the mold could be surrounded by a material that weakens it to cause it to fracture more readily than the molded object in response to thermal stress. The process could be used where stresses develop because of mold-object adhesion, or for molds which, when cooled, contract more than the object. It also applies when movement due to thermal contraction is inhibited by the shape of the mold. Any of various reacting materials could be used, including those that may be a liquid at room temperature. While it is preferred that the reacting material be coextensive in the axial direction with the ingot, experimental evidence shows that this may not be necessary in all cases. Various other embodiments and modifications may be made by those skilled in the art without departing from the spirit and scope of the invention.

We claim:

1. The process of making an ingot of a semiconductor material comprising the steps of:
   putting a semiconductor material in a crucible having a first wall, a first surface of which contains the first material;
   heating the crucible to cause the semiconductor material to flow;
   cooling the crucible in such a manner as to solidify the semiconductor material to form a crystalline ingot having an outer surface that conforms to the inner surface of the crucible, characterized by the step of:
   contacting a second surface of the first wall opposite the first surface with a second material of a type which reacts with the crucible.

2. The process of claim 1 wherein:
   the first wall is of sufficient thickness to separate substantially the second material from the first material during the heating and cooling steps, but is sufficiently thin that the second material significantly weakens the structural integrity of the first wall through reaction therewith, whereby stresses on the ingot during the cooling step are relieved by fracture of the first wall.

3. The process of claim 2 wherein:
   during the cooling step the ingot and the crucible contract at different rates, thereby to cause said stresses on the ingot and the first wall which are relieved by fracture of the first wall.

4. The process of claim 3 wherein:
   the semiconductor material melts during the heating step;
   the molten first material contacts the first surface of the first wall during the crucible heating step;
   and the cooling step freezes the semiconductor material into an ingot, at least a major portion of which constitutes a single crystal.

5. The method of claim 4 wherein:
   an encapsulant material is placed in the crucible along with the semiconductor material, which melts during the heating step and most of said encapsulant material floats on the molten semiconductor material.

6. The method of claim 5 wherein:
   at least part of the encapsulant material forms a layer which, upon freezing, bonds the ingot to the first wall, thereby transferring stresses between the ingot and the first wall.

7. The method of claim 6 wherein:

the semiconductor material is a compound semiconductor;

the first wall is of glass and the second material is an inorganic salt, which in its molten form is capable of reacting with glass.

8. The method of claim 7 wherein:

a monocrystalline seed crystal is first placed into a bottom end of the crucible and the crucible is cooled such as to freeze the compound semiconductor material progressively from the seed crystal toward the top of the crucible.

9. The method of claim 8 wherein:

the crucible is oriented vertically and the vertical gradient freeze process is used for melting the raw material and controllably freezing the compound semiconductor material such that at least a major portion of it constitutes a single crystal extending from the seed crystal.

10. The method of claim 9 wherein:

the seed crystal is oriented such that the compound semiconductor grows in a direction corresponding to the <100> crystallographic orientation.

11. The method of claim 6 wherein:

the first wall is of a substantially cylindrical shape and the inorganic salt is held in contact with the first wall by a second cylindrical wall that surrounds the first wall.

12. The method of claim 11 wherein:

the inorganic salt is calcium chloride.

13. The method of claim 12 wherein:

the semiconductor material is a group III-V material;

and an external gas pressure is applied to the surface of the molten semiconductor material to retard the escape therefrom of vaporized elemental group V material.

14. The method of claim 13 wherein:

the encapsulant is boric oxide, and the III-V material is indium phosphide.

15. A VGF process for making large single crystals of group III-V semiconductor material comprising the steps of: introducing into the bottom part of a crucible a monocrystalline seed crystal of the group V material; introducing over the seed crystal a quantity of group III-V raw material; heating the crucible to melt the group III-V raw material and part of the seed crystal; and freezing the group III-V material such that it progressively freezes in a vertically upward direction, wherein:

a wall of the crucible having one surface contacting the molten group III-V material is contacted on its opposite surface with a second material of a type which, when melted, reacts with the material with which the crucible is made;

the heating step melts the second material, whereby the second material reacts with the crucible wall to weaken it structurally such that stresses between the III-V material and the crucible wall during the freezing step are substantially relieved by fracture of the crucible wall.

16. The method of claim 15 wherein:

the second material is held in contact with the crucible wall by a second wall that surrounds the crucible wall.

17. The method of claim 16 wherein:

the crucible wall is made of glass and the second material is calcium chloride.

18. The method of claim 17 wherein:

the seed crystal is oriented in the bottom of the crucible such that its upper surface constitutes a {100} crystallographic surface, whereby freezing of the group III-V material proceeds vertically upwardly in the <100> crystallographic direction.

19. The method of claim 18 wherein:

an encapsulant material is placed in the crucible along with the raw material, which melts during the heating step and most of which floats on the molten group III-V material.

20. The method of claim 19 wherein:

the frozen III-V crystal has a central axis;

and wafers are cut from the crystal by slicing perpendicularly to the central axis.

21. Apparatus for making large single crystals of a compound semiconductor material comprising: a crucible for containing a monocrystalline seed crystal of the compound material to be made and a quantity of raw semiconductor material in contact with the seed crystal; means for heating the crucible to melt the raw material and part of the seed crystal; a first wall of the crucible contacting the raw material in its molten state; and means for reducing the temperature of the crucible such that the molten material freezes first at its interface with the seed crystal, and then freezes progressively therefrom, wherein:

the crucible has a second wall for containing between it and the first wall a second material of a type which, when melted, chemically reacts with the material from which the first wall is made.

22. The apparatus of claim 21 wherein:

the first wall is of sufficient thickness to separate substantially the second material from the raw material during the heating and cooling steps, but is sufficiently thin that the molten second material significantly weakens the structure of the first wall through reaction therewith.

23. The apparatus of claim 22 wherein:

the first wall is of glass and the second material is an inorganic salt, which in its molten form is capable of reacting with glass.

24. The apparatus of claim 23 wherein:

the raw material is a III-V material;

and the first material is calcium chloride.

25. The apparatus of claim 24 wherein:

the crucible is adapted to contain boric oxide.

26. The apparatus of claim 25 wherein:

the first wall is of a substantially cylindrical shape and the second wall is of a substantially cylindrical shape surrounding the first wall;

and both the first and second walls are made of quartz glass.

* * * * *